United States Patent [19]

Sakurai

[11] Patent Number: 5,694,084
[45] Date of Patent: Dec. 2, 1997

[54] WIDE-BAND AMPLIFIER CIRCUITS

[75] Inventor: Hisao Sakurai, Saitama, Japan

[73] Assignee: Sony Corporation, Tokyo, Japan

[21] Appl. No.: 630,781

[22] Filed: Apr. 10, 1996

[30]  Foreign Application Priority Data

Apr. 14, 1995 [JP] Japan .................................. 7-089338

[51] Int. Cl.⁶ ................................ H03F 3/04; H04N 5/14
[52] U.S. Cl. ................................................ 330/288; 348/707
[58] Field of Search ................................. 327/310, 311; 330/262, 288; 348/707

[56]  References Cited

U.S. PATENT DOCUMENTS

| | | | |
|---|---|---|---|
| 4,110,635 | 8/1978 | Hongu et al. | 307/233 R |
| 4,758,799 | 7/1988 | Ho et al. | 330/311 |
| 4,999,586 | 3/1991 | Meyer et al. | 330/288 |
| 5,180,989 | 1/1993 | Sakurai et al. | 330/295 |
| 5,293,101 | 3/1994 | Sakurai | 315/383 |
| 5,337,010 | 8/1994 | Nishiyama | 330/255 |

*Primary Examiner*—Steven Mottola
*Attorney, Agent, or Firm*—Jay H. Maioli

[57]  ABSTRACT

A wide-band amplifier circuit includes first to eighth transistors, a plurality of resistors, a capacitor and an output terminal. The first transistor has its base supplied with an input signal, the second transistor is connected in series through a first impedance circuit portion to a collector-emitter path of the first transistor for functioning as a diode, the third transistor is connected to form a first current mirror circuit portion together with the second transistor and has its collector connected through a first resistor to one end of a power source, the fourth transistor has its base connected to a connecting point between the collector of the third transistor and the first resistor, the fifth transistor has its collector-emitter path connected in series to a collector-emitter path of the fourth transistor, the sixth transistor has its base supplied with the input signal, the seventh transistor connected in series through a second impedance circuit portion including a second resistor and a capacitor to a collector-emitter path of the sixth transistor so as to form a second current mirror circuit portion together with the fifth transistor, and the eighth transistor having its collector-emitter path connected between one end of the second impedance circuit portion and one end of the power source and its base connected to a bias voltage source. A third resistor is connected between the other end of the second impedance circuit portion and the other end of the power source and the output terminal derived from a connection point between the emitter of the fourth transistor and the collector of the fifth transistor.

6 Claims, 4 Drawing Sheets

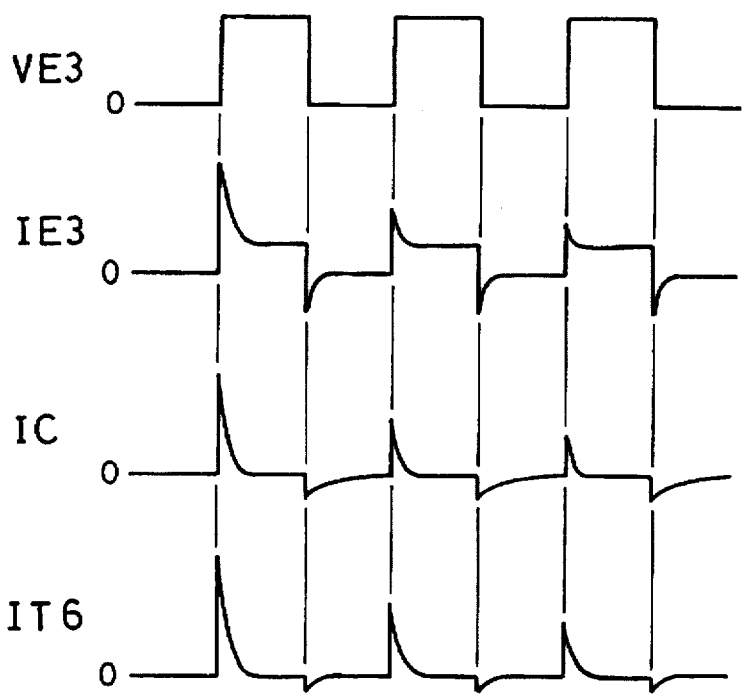
FIG. 6A  VE3
FIG. 6B  IE3
FIG. 6C  IC
FIG. 6D  IT6
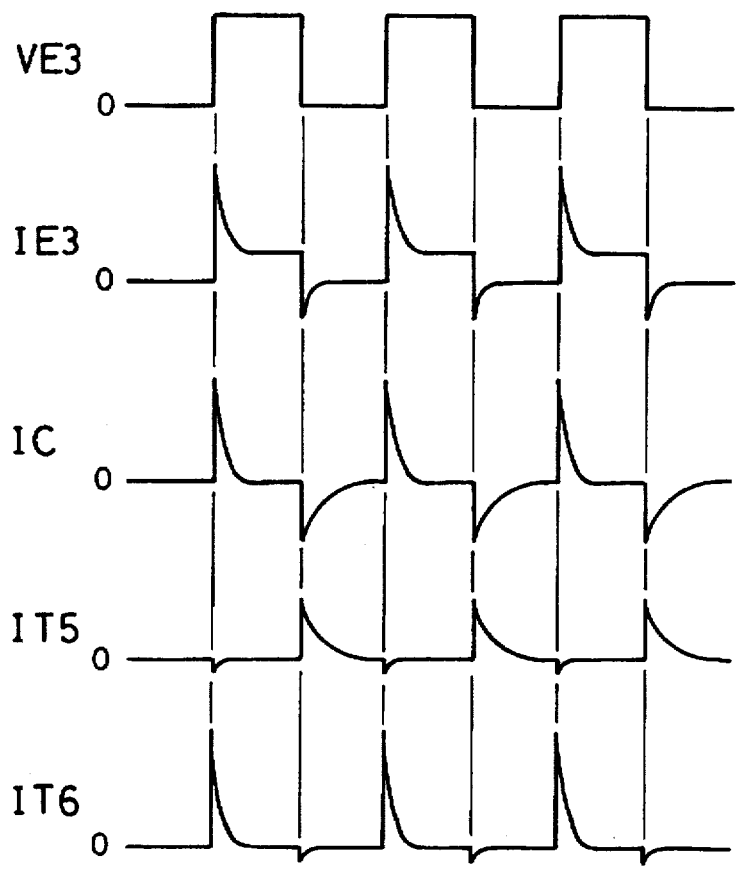
FIG. 7A  VE3
FIG. 7B  IE3
FIG. 7C  IC
FIG. 7D  IT5
FIG. 7E  IT6

WIDE-BAND AMPLIFIER CIRCUITS

BACKGROUND OF THE INVENTION

1. Field of the Invention

This invention relates generally to wide-band amplifier circuits, and more particularly, is directed to improvements in a wide-band amplifier circuit which comprises a plurality of transistors and is suited to be used for amplifying a video signal in an image display apparatus in which images based on the video signal are displayed on a cathode ray tube or the like.

2. Description of the Prior Art

In an image display apparatus wherein a cathode ray tube for image display having a display panel portion is provided and a video signal is supplied to the cathode ray tube so as to obtain images based on the video signal on the display panel portion of the cathode ray tube, a video signal amplifying circuit is used for amplifying the video signal which is to be supplied to the cathode ray tube. In past days in which technologies for integration of electronic circuits were not so developed as the present age, such a video signal amplifier circuit was usually formed with a so-called discrete circuit structure comprising a plurality of independent transistors.

As for the video signal amplifier circuit formed with the discrete circuit structure, in the case where it is required that the circuit be operative with various high grade functions, circuit construction on an extremely large scale is necessary and therefore a steep rise in cost is brought about. Accordingly, in the present days in which the technologies for integration of electronic circuits have remarkably developed, it has been proposed to constitute the video signal amplifier circuit, which is used in the image display apparatus having the cathode ray tube, in the form of a semiconductor integrated circuit. This results in improved operation in function and apparent reduction in cost on the video signal amplifier circuit.

The most important matter in constituting the video signal amplifier circuit in the form of the semiconductor integrated circuit is to provide the video signal amplifier circuit with a superior flat frequency characteristic and an excellent transient response characteristic. Incidentally, in accordance with the frequency characteristic which a video signal amplifier circuit put into practice nowadays is generally required to have, for example, a level of −3 dB should be obtained in response to an input signal in the frequency band from 150 MHz to 200 MHz. Therefore, a sufficient amplifying effect should be obtained to input signals having frequencies in a broad frequency band from zero (direct current signal) to 200 MHz under a condition in which when an output signal is arranged to have an amplitude of 4 Vp-p (4 volts at peak to peak). It is indispensable for the video signal amplifier circuit, which is intended to be provided with the superior frequency characteristic and the excellent transient response characteristic, to have an output stage thereof which is able to process rapidly signals having frequencies in that is able to process rapidly signals over a broad frequency band.

As for video signal amplifier circuits proposed previously, it is usual to have an output stage constituted in the form of an emitter-follower configuration comprising a transistor having its emitter connected to a current source or a resistor functioning substantially as a current source, as shown in FIGS. 1 or 2. The output stage of the video signal amplifier circuit shown in FIG. 1 comprises a transistor 11A of the NPN type having its collector connected with a source voltage supplying portion +B forming one end of a power source and its emitter grounded through a current source 12 and a capacitive load 13 connected to a connecting point between the emitter of the transistor 11A and the current source 12. An input video signal Sv is supplied through an input terminal 14 to a base of the transistor 11A and an output video signal So is obtained at the emitter of the transistor 11A.

In the output stage shown in FIG. 1, supposing that a stray capacitance in parallel with the current source 12 is Cs, a capacitance of the capacitive load 13 is CL and an amplitude of the output video signal So is Vo, a current value Io which the current source 12 is required to have is represented by the following equation (1):

$$Io = (CL + Cs) \cdot Vo / T, \quad (1)$$

where T represents a rising time or a falling time of the output video signal So responding to voltage steps in the input video signal Sv.

In this case, supposing that CL equals 12 pF, Cs equals 10 pF and Vo equals to 4 Vp-p, T must be equal to 2.5 nS in order that a level of −3 dB is obtained in response to a frequency component of 140 MHz of the input video signal Sv, and therefore the current value Io must be 35.2 mA in accordance with the equation (1).

The output stage of the video signal amplifier circuit shown in FIG. 2 comprises a transistor 11B of the NPN type having its collector connected with a power source +B supplying a source voltage and its emitter grounded through a resistor 15 and a capacitive load 13 connected to a connecting point between the emitter of the transistor 11B and the resistor 15. An input video signal Sv is supplied through an input terminal 14 to a base of the transistor 11B and an output video signal So is obtained at the emitter of the transistor 11B.

In the output stage shown in FIG. 2, supposing that a stray capacitance in parallel with the resistor 15 is Cs, a capacitance of the capacitive load 13 is CL and an amplitude of the output video signal So is Vo, a current value Ir which is required to flow through the resistor 15 is represented by the following equation (2):

$$Ir = (CL + Cs) \cdot Vo / T \quad (2)$$

where T represents a rising time or a falling time of the output video signal So responding to voltage steps in the input video signal Sv.

In this case also, supposing that CL equals 12 pF, Cs equals 10 pF and Vo equals to 4 Vp-p, T must be equal to 2.5 nS in order that a level of −3 dB is obtained in response to a frequency component of 140 MHz of the input video signal Sv, and therefore the current value Ir must be 35.2 mA in accordance with the equation (2).

As described above, each of the current value Io which should be supplied to the current source 12 provided in the output stage of the video signal amplifier circuit as shown in FIG. 1 and the current value Ir which should flow through the resistor 15 provided in the output stage of the video signal amplifier circuit as shown in FIG. 2 is determined to be, for example, 35.2 mA. The current value Io is a value of a constant current and the current value Ir is a value of substantially constant current. Accordingly, in each of the output stages of the video signal amplifier circuit as shown in FIG. 1 and the output stage of the video signal amplifier circuit as shown in FIG. 2, even in the case where the source voltage supplied from the power source +B is relatively low, such as 9 V, for example, power consumption Wo amounts to about 317 mW (Wo=35.2 mA·9 V ≈317 mW).

The power consumption Wo of about 317 mW thus calculated corresponds to a relatively large power consumption for a semiconductor integrated circuit. In practice, it is required for a circuit package containing the video signal amplifier circuit constituted in the form of the semiconductor integrated circuit to have a high heat radiation and, in the case where such a requirement is not satisfied, it will be feared that the video signal amplifier circuit is damaged due to generation of heat.

Accordingly, with the intention of the reduction in power consumption mentioned above, it may be considered to form the output stage of the video signal amplifier circuit with a pair of complementary transistors, as shown in FIG. 3. In the output stage of the video signal amplifier circuit shown in FIG. 3, a transistor 11C of the NPN type having its collector connected with a power source +B supplying a source voltage and another transistor 16 of the PNP type having its emitter-collector path connected in series with a collector-emitter path of the transistor 11C are provided. A collector of the transistor 16 is grounded and a bias voltage source 17 is connected between a base of the transistor 11C and a base of the transistor 16. Further, a capacitive load 13 is connected to a connecting point between an emitter of the transistor 11C and an emitter of the transistor 16. Then, an input video signal Sv is supplied through an input terminal 14 to the base of the transistor 11C and an output video signal So is obtained at the emitter of the transistor 11C under a condition in which the transistors 11C and 16 are arranged to perform class B amplification.

In such a case, an idling current flowing through the collector-emitter path of the transistor 11C and the emitter-collector path of the transistor 16 is reduced to be, for example, hundreds of A (microamperes). This idling current of hundreds of A is extremely smaller than an idling current flowing through the transistor 11A of the NPN type constituting the output stage of the video signal amplifier circuit shown in FIG. 1 or an idling current flowing through the transistor 11B of the NPN type constituting the output stage of the video signal amplifier circuit shown in FIG. 2. Therefore, if the output stage of the video signal amplifier circuit shown in FIG. 3 were realized, power consumption in the video signal amplifier circuit is effectively and remarkably reduced.

However, when the transistors 11C and 16 forming the pair of complementary transistors are prepared, it is very difficult to obtain the transistor 16 of the PNP type having performances the same as that of the transistor 11C of the NPN type even with the present semiconductor technology and a transistor of the PNP type which may be compelled to be used as the transistor 16 is of low cut-off frequency (Ft) and presents an increase in the output impedance to an input signal component having a frequency higher than 100 MHz so as not to operate appropriately. That is, it is quite difficult to obtain a transistor of the PNP type which has such performance for use an transistor 16 and therefore it is substantially impossible to realize the output stage of the video signal amplifier circuit shown in FIG. 3.

OBJECTS AND SUMMARY OF THE INVENTION

Accordingly, it is an object of the present invention to provide a wide-band amplifier circuit used for amplifying a video signal in an image display apparatus in which images based on the video signals are displayed on a cathode ray tube or the like, which avoids the aforementioned difficulties encountered with the prior art.

Another object of the present invention is to provide a wide-band amplifier circuit suited to be used for amplifying a video signal in an image display apparatus in which images based on the video signals are displayed on a cathode ray tube or the like, which is provided with a superior level-frequency characteristic and an excellent transient response characteristic required for constituting an output stage of a video signal amplifier circuit.

A further object of the present invention is to provide a wide-band amplifier circuit used for amplifying a video signal in an image display apparatus in which images based on the video signals are displayed on a cathode ray tube or the like, which is provided with a superior flat frequency and an excellent transient response characteristic with which amplification of signals over a wide frequency band can be appropriately carried out.

A still further object of the present invention is to provide a wide-band amplifier circuit used for amplifying a video signal in an image display apparatus in which images based on the video signals are displayed on a cathode ray tube or the like, which is provided with a superior level-frequency characteristic and an excellent transient response characteristic with which amplification of signals over a wide frequency band can be appropriately carried out and constituted in the form of a semiconductor integrated circuit operating with reduced power consumption.

According to an aspect of the present invention, there is provided a wide-band amplifier circuit that comprises a first transistor having its base supplied through an input terminal with an input signal, a second transistor connected in series through a first impedance circuit portion to a collector-emitter path of the first transistor for functioning as a diode, a third transistor connected to form a first current mirror circuit portion together with the second transistor and having its collector connected through a first resistor to one end of a power source, a fourth transistor having its base connected to a connecting point between the collector of the third transistor and the first resistor, a fifth transistor having its collector-emitter path connected in series to a collector-emitter path of the fourth transistor, a sixth transistor having its base supplied with the input signal, a seventh transistor connected in series through a second impedance circuit portion including a second resistor and a capacitor to a collector-emitter path of the sixth transistor so as to form a second current mirror circuit portion together with the fifth transistor, an eighth transistor having its collector-emitter path connected between one end of the second impedance circuit portion and said one end of the power source and its base connected to a bias voltage source, a third resistor connected between the other end of the second impedance circuit portion and the other end of the power source, and an output terminal derived from a connection point between the emitter of the fourth transistor and the collector of the fifth transistor.

In the wide-band amplifier circuit thus constituted in accordance with the present invention, basically, the first to fourth transistors are operative to provide polarity-inverse amplification to the input signals supplied through the input terminal and an output signal produced by causing the input signal to be subjected to amplification and polarity inversion is obtained at the output terminal. The output signal derived from the emitter of the fourth transistor to the output terminal rises when the input signal falls, so that a driving current is supplied to a load connected to the output terminal. During this operation, a current flowing through the collector-emitter path of the sixth transistor which has the base thereof supplied with the input signal is reduced or stopped and a discharging current from the capacitor included in the second impedance circuit portion flows through the collector-emitter path of the eighth transistor and the third resistor connected between the other end of the second impedance circuit portion and the other end of the power source, so that there is little current flowing through the collector-emitter path of the fifth transistor. That is, the capacitor included in the second impedance circuit portion is quickly discharged and the fifth to eighth transistors do not have any particular effect on the load connected to the output terminal.

On the other hand, the output signal derived from the emitter of the fourth transistor to the output terminal falls when the input signal rises. During this operation, a relatively large current flows through the collector-emitter path of the sixth transistor and a charging current to the capacitor included in the second impedance circuit portion flows through the collector-emitter path of the seventh transistor, so that a current flows through the collector-emitter path of the fifth transistor into the load connected to the output terminal and thereby the load is driven. That is, the fall time on the voltage of the output signal is prevented from lengthening when the output signal obtained at the output terminal falls.

In such a manner as mentioned above, the collector-emitter path of the eighth transistor and the third resistor connected between the other end of the second impedance circuit portion and the other end of the power source in the aggregate form a discharging current path to the capacitor included in the second impedance circuit portion, and thereby a discharging time on the capacitor included in the second impedance circuit portion is shortened so that the current flowing through the collector-emitter path of the fifth transistor can respond appropriately to the input signal supplied through the input terminal even when the frequency of the input signal is relatively high.

Further, it is not required to arrange the current flowing through the collector-emitter path of the fifth transistor to correspond to the maximum of a current necessitated for driving the load but allowed to arrange the current flowing through the collector-emitter path of the fifth transistor to correspond to the current necessitated for driving the load under a situation wherein the current flowing through the collector-emitter path of the fifth transistor is set to drive the load in response to frequency components of the input signal over a frequency band including a certain upper limit frequency. This results in effective reduction in power consumption in the circuit.

The above and other objects, features and advantages of the present invention will become apparent from the following detailed description which is to be read in conjunction with the accompanying drawings.

BRIEF DESCRIPTION OF THE DRAWINGS

FIGS. 6A, 6B, 6C and 6D and FIGS. 7A, 7B, 7C, 7D and 7E are waveforms used for explaining the operation of the embodiment shown in FIG. 1.

DESCRIPTION OF THE PREFERRED EMBODIMENT

Figure 4:
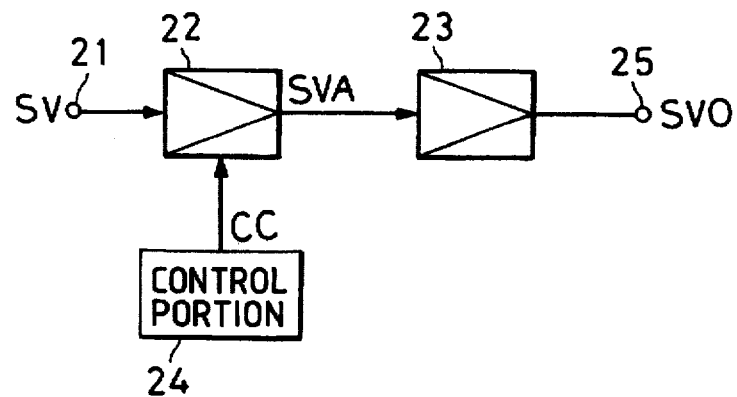
FIG. 4 is a block diagram showing an example of a video signal amplifier circuit to which an embodiment of wide-band amplifier circuit according to the present invention can be applied.

FIG. 4 shows an example of a video signal amplifier circuit for use in an image display apparatus in which images based on video signals are displayed on a cathode ray, to which an embodiment of wide-band amplifier circuit according to the present invention can be applied. This video signal amplifier circuit comprises a video signal input terminal 21, an input stage 22 supplied through the video signal input terminal 21 with a video signal SV, an output stage 23 supplied with a video signal SVA obtained from the input stage 22, and a video signal output terminal 25 to which an output video signal SVO is derived from the output stage 23.

A control signal CC from a control portion 24 accompanying the input stage 22 is supplied to the input stage 22 and the video signal SV from the video signal input terminal 21 is subjected to amplification control in response to the control signal CC in the input stage 22. The video signal SVA obtained by amplifying the video signal SV is subjected further to amplification in the output stage 23 to produce the output video signal SVO.

Figure 5:
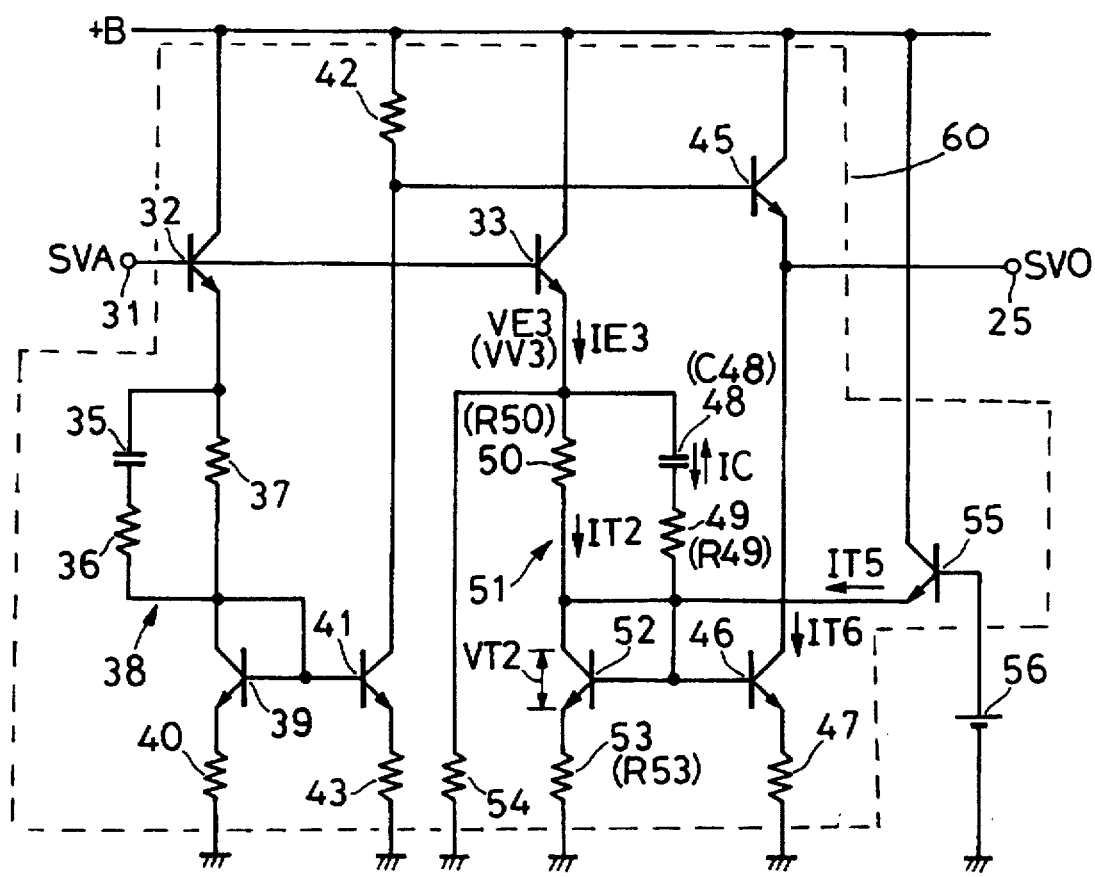
FIG. 5 is a circuit diagram showing an embodiment of wide-band amplifier circuit according to the present invention.

The embodiment of the wide-band amplifier circuit according to the present invention is applied to the video signal amplifier circuit shown in FIG. 4 to constitute the output stage 23. FIG. 5 shows the embodiment of wide-band amplifier circuit according to the present invention.

In the embodiment shown in FIG. 5, transistors 32 and 33 of the NPN type each having its base connected to an input terminal 31 are provided. A collector of each of the transistors 32 and 33 is connected to a source voltage supplying portion +B forming one end of a power source.

An impedance circuit portion 38 including a series connection of a capacitor 35 and a resistor 36 and a resistor 37 connected in parallel with the series connection of the capacitor 35 and the resistor 36 is connected to an emitter of the transistor 32. A transistor 39 of the NPN type having its base and collector coupled with each other for functioning as a diode is connected through the impedance circuit portion 38 to a collector-emitter path of the transistor 32. An emitter of the transistor 39 is connected through a resistor 40 to a reference potential portion forming the other end of the power source.

A transistor 41 of the NPN type has its base connected to the base and collector of the which are coupled with each other. A collector of the transistor 41 is connected through a resistor 42 to the source voltage supplying portion +B and an emitter of the transistor 41 is connected through a resistor 43 to the reference potential or ground. The transistor 41 forms a current mirror circuit together with the transistor 39 functioning as the diode.

A base of a transistor 45 of the NPN type is connected to a connecting point between the collector of the transistor 41 and the resistor 42. A collector of the transistor 45 is connected to the source voltage supplying portion +B. A transistor 46 of the NPN type is provided to have its collector-emitter path connected in series to a collector-emitter path of the transistor 45. An emitter of the transistor 46 is connected through a resistor 47 to the reference potential portion.

An impedance circuit portion 51 including a series connection of a capacitor 48 and a resistor 49 and a resistor 50 connected in parallel with the series connection of the capacitor 48 and the resistor 49 is connected to an emitter of the transistor 33. A transistor 52 of the NPN type having its base and collector coupled with each other for functioning as a diode is connected through the impedance circuit portion 51 to a collector-emitter path of the transistor 33. An emitter of the transistor 52 is connected through a resistor 53 to the reference potential portion.

The base and collector of the transistor 52 coupled with each other is connected to a base of the transistor 46 and the transistor 52 functioning as a diode forms a current mirror circuit portion together with the transistor 46. A resistor 54 is connected between the emitter of the transistor 33 and the reference potential portion.

A transistor 55. of the NPN type is provided to have its collector-emitter path connected between one end of the impedance circuit portion 51 and the source voltage supplying portion +B. A bias voltage source 56 is connected between a base of the transistor 55 and the reference potential portion. Further, the video signal output terminal 25 is connected to a connecting point between the emitter of the transistor 45 and the collector of the transistor 46.

Various circuit elements including the above mentioned eight transistors 32, 33, 39, 41, 45, 46, 52 and 55 are provided on a common semiconductor substrate to form a semiconductor integrated circuit, as shown by the broken line 60 in FIG. 5.

In the embodiment thus constituted, basically, the transistors 32, 39, 41 and 45 are operative to function as a polarity-inverse amplification to the video signal SVA supplied through the input terminal 31 and the output video signal SVO produced by causing the video signal SVA to be subjected to amplification and polarity inversion is obtained at the video signal output terminal 25.

In the amplification to the video signal SVA, when the video signal SVA supplied through the input terminal 31 to the base of the transistor 32 falls, the current flowing through the collector-emitter path of the transistor 32, the impedance circuit portion 38, the transistor 39 and the resistor 40 is reduced or ceases altogether thereby causing the current flowing through the resistor 42 the resistor 43, and, the collector-emitter path of the transistor 41, which forms the current mirror circuit portion together with the transistor 39, is also reduced for ceases altogether. With the reduction or stopping of the current flowing through the resistor 43, a voltage supplied to the base of the transistor 45 rises and the voltage at the emitter of the transistor 45 also rises, so that the output video signal SVO obtained at the video signal output terminal 25 rises. As a result, a driving current based on the risen output video signal SVO is supplied to a load connected to the video signal output terminal 25.

During such an operation, a current flowing through the collector-emitter path of the transistor 33 which has the base thereof supplied with the video signal SVA is reduced or stopped in response to the fall in the video signal SVA and the capacitor 48 included in the impedance circuit portion 51 discharges. A discharging current from the capacitor 48 flows through the collector-emitter path of the transistor 55, the resistor 49, the capacitor 48 and the resistor 54 and there is little current flowing through the collector-emitter path of the transistor 46. With such a discharging current path formed to include the collector-emitter path of the transistor 55 and the resistor 54, the capacitor 48 included in the impedance circuit portion 51 is very quickly discharged and the transistors 33, 52, 46 and 55 do not have any particular effect on the load connected to the video signal output terminal 25.

On the other hand, when the video signal SVA rises, the current flowing through the collector-emitter path of the transistor 32, the impedance circuit portion 38, the transistor 39 and the resistor 40 is increased and thereby the current flowing through the resistor 42, the collector-emitter path of the transistor 41, which forms the current mirror circuit portion together with the transistor 39, and the resistor 43 is increased also. With the increase in the current flowing through the resistor 43, the voltage supplied to the base of the transistor 45 falls and the voltage at the emitter of the transistor 45 also falls, so that the output video signal SVO obtained at the video signal output terminal 25 falls.

During such an operation, a current flowing through the collector-emitter path of the transistor 33 which has the base thereof supplied with the video signal SVA, the impedance circuit portion 51, the transistor 52 and the resistor 53 is increased in response to the rise in the video signal SVA and a current flowing through the collector-emitter path of the transistor 46, which forms the current mirror circuit portion together with the transistor 52, and the resistor 47 is increased also. This current flowing through the collector-emitter path of the transistor 46 and the resistor 47 is supplied to the load connected to the video signal output terminal 25 as the driving current. As a result, the fall time on the voltage of the output video signal SVO is prevented from lengthening when the output video signal SVO obtained at the video signal output terminal 25 falls.

Further, the capacitor 48 included in the impedance circuit portion 51 is charged with the current flowing through the collector-emitter path of the transistor 33, the impedance circuit portion 51, the transistor 52 and the resistor 53. At this time, since the capacitor 48 is in such a condition as to be very quickly discharged by virtue of the discharging current path formed to include the collector-emitter path of the transistor 55 and the resistor 54, the capacitor 48 is quickly and appropriately charged with the current flowing through the collector-emitter path of the transistor 33.

In such an embodiment as described above, supposing that a voltage value of an emitter voltage VE3 on the transistor 33 is VV3, a voltage value of a collector-emitter voltage on the transistor 52 is VT2, resistances of the resistors 49, 50 and 53 are R49, R50 and R53, respectively, and a capacitance of the capacitor 48 is C48, a current value IA2 of a current IT2 flowing through the transistor 52 is represented by the following equation:

$$IA2=(VV3-VT2)/(Z+R53),$$

where $Z=R50\cdot(1+j\omega C48\cdot C49)/(1+j\omega C48\cdot R49+j\omega C48\cdot R50)$ The resistance R50 of the resistor 50 is selected to be relatively large (for example, 10 KΩ) in order to reduce a direct current component in the current flowing through the transistor 52.

Supposing that a ratio of the current IA2 flowing through the transistor 52 to a current flowing through the transistor 46 which forms the current mirror circuit portion together with the transistor 52 is 1:N, a current value ZA6 of a current IT6 flowing through the collector-emitter path of the transistor 46 is represented by the following equation:

$$AS6=N\cdot IA2=N\cdot(VV3-VT2)/(Z+R53)$$

Since the transistor 52 has its collector and base coupled with each other for functioning as a diode, the voltage value VT2 of the collector-emitter voltage on the transistor 52 is about 0.7 V. Therefore, the current value IA6 of the current IT6 is represented by the following equation:

$IA6 \approx N \cdot (VV3-0.7)/(Z+R53)$      (3)

Now, such an imaginary circuit that the transistors 55 and the resistor 54 are not connected to make the discharging current path including the collector-emitter path of the transistor 55 and the resistor 54 is considered below.

When the emitter voltage VE3 on the transistor 33 varies as shown in FIG. 6A in response to rising and falling variations in the video signal SVA supplied through the input terminal 31 to the base of the transistor 33, an emitter current IE3 in the transistor 33 varies as shown in FIG. 6B. A charging and discharging current IC flowing through the capacitor 48 includes a positive charging current component flowing in response to each rise in the emitter voltage VE3 and a negative discharging current component flowing in response to each fall in the emitter voltage VE3 as shown in FIG. 6C. Since the resistance R50 of the resistor 50 is selected to be relatively large, the negative discharging current component flows through the resistor 50 and 49 with a relatively small amplitude over a relatively long period. The whole amplitude of the charging and discharging current IC is stabilized in a condition in which an area of the positive charging current component equals an area of the negative discharging current component.

The current IT6 flowing through the collector-emitter path of the transistor 46 includes positive and negative components flowing respectively in response to each rise and each fall in the emitter voltage VE3 on the transistor 33 as shown in FIG. 6D. The amplitude of the positive component varies in response to variations in the amplitude of the positive charging current component flowing through the capacitor 48 and is stabilized together with the amplitude of the positive charging current component flowing through the capacitor 48. Accordingly, in the case where the video signal SVA supplied through the input terminal 31 to the bases of the transistors 32 and 33 has relatively high frequencies, the positive component of the current IT6 flowing through the collector-emitter path of the transistor 46 cannot have a relatively large amplitude, and therefore the driving current flowing through the collector-emitter path of the transistor 46 is not sufficiently supplied to the lead connected to the video signal output terminal 25 when the output video signal SVO obtained at the video signal output terminal 25 falls.

In the actual circuit of the embodiment, the transistors 55 and the resistor 54 are connected to form the discharging current path of the collector-emitter path of the transistor 55 and the resistor 54. Accordingly, when the emitter voltage VE3 on the transistor 33 varies as shown in FIG. 7A in response to rising and falling variations in the video signal SVA supplied through the input terminal 31 to the base of the transistor 33, the emitter current IE3 in the transistor 33 varies as shown in FIG. 7B. The charging and discharging current IC flowing through the capacitor 48 includes the positive charging current component flowing with a relatively large amplitude in response to each rise in the emitter voltage VE3 and the negative discharging current component flowing with a relatively large amplitude in response to each fall in the emitter voltage VE3 as shown in FIG. 7C.

A current IT5 flowing through the collector-emitter path of the transistor 55 is supplied to the capacitor 48 as the charging current, as shown in FIG. 7D. The current IT6 flowing through the collector-emitter path of the transistor 46 includes the positive and negative components flowing respectively in response to each rise and each fall in the emitter voltage VE3 on the transistor 33, as shown in FIG. 7E, and the positive component of the current IT6 has a relatively large amplitude based on the positive charging current component of the charging and discharging current IC flowing through the capacitor 48. Consequently, even in the case where the video signal SVA supplied through the input terminal 31 to the bases of the transistors 32 and 33 has relatively high frequencies, the positive component of the current IT6 flowing through the collector-emitter path of the transistor 46 is able to have a relatively large amplitude, and therefore the driving current flowing through the collector-emitter path of the transistor 46 is sufficiently supplied to the load connected to the video signal output terminal 25 when the output video signal SVO obtained at the video signal output terminal 25 falls.

Figure 8:
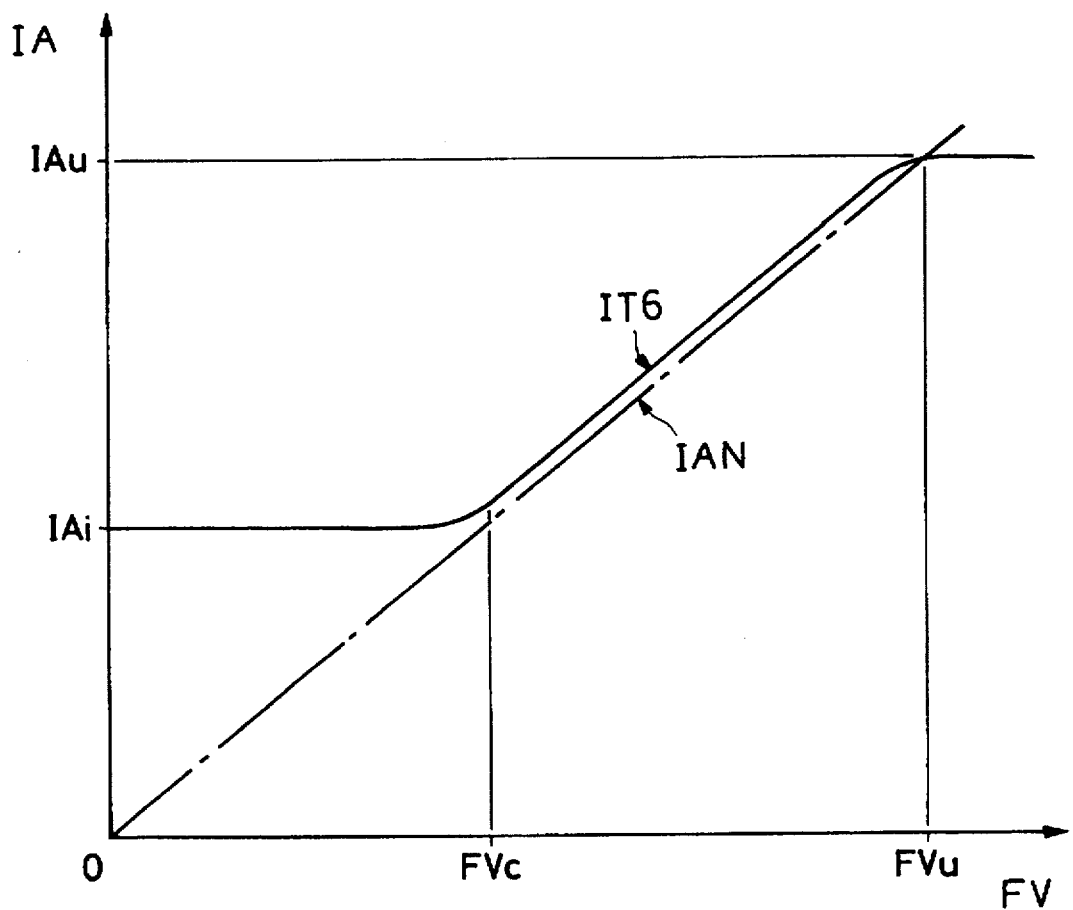
FIG. 8 is a characteristic chart used for explaining the operation of the embodiment shown in FIG. 1.

FIG. 8 shows a relation between the frequency of the video signal SVA and the current IT6 flowing through the collector-emitter path of the transistor 46 under a condition in which a capacitive load is connected to the video signal output terminal 25. In FIG. 8, the abscissa represents frequency FV and the oridnate axis represents current value IA, and the relation between the frequency of the video signal SVA and the current IT6 is represented with a solid line. A dot-dash line in FIG. 8 represents the minimum driving current value IAN necessitated for driving the capacitive load connected to the video signal output terminal 25.

In the condition of FIG. 8, the uppermost frequency of the video signal SVA which is able to drive the the capacitive load connected to the video signal output terminal 25 is set to be FVu and the lowermost frequency of the video signal SVA with which the capacitor 48 is substantially concerned is set to be FVc.

As shown in FIG. 8, the current IT6 flowing through the collector-emitter path of the transistor 46 has a relatively low constant current value IAi which is higher than the minimum driving current value IAN when the frequency of the video signal SVA is equal to or lower than the lowermost frequency FVc. This current value IAi is obtained under a condition in which the capacitor 48 is not substantially concerned with the video signal SVA and therefore set in accordance with the following equation obtained by replacing Z in the equation (3) with the resistance R50 of the resistor 50. $IA6 \approx N \cdot (VV3-0.7)/(R50+R53)$ The current IT6 having the current value IAi forms an idling current flowing through the collector-emitter path of the transistor 46.

The current IT6 flowing through the collector-emitter path of the transistor 46 has a current value slightly higher than the minimum driving current value IAN when the frequency of the video signal SVA is higher than the lowermost frequency FVc but equal to or lower than the uppermost frequency FVu. This current value slightly higher than the minimum driving current value IAN is obtained under a condition in which the capacitor 48 is substantially concerned with the video signal SVA and therefore set in accordance with equation (3). The current IT6 has the maximum current value IAu in response to the uppermost frequency FVu of the video signal SVA.

Figure 1:
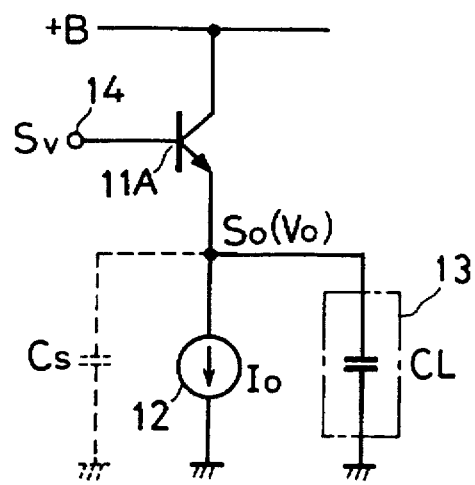
FIG. 1 is a circuit diagram showing an example of an output stage of a video signal amplifier circuit proposed previously.
Figure 2:
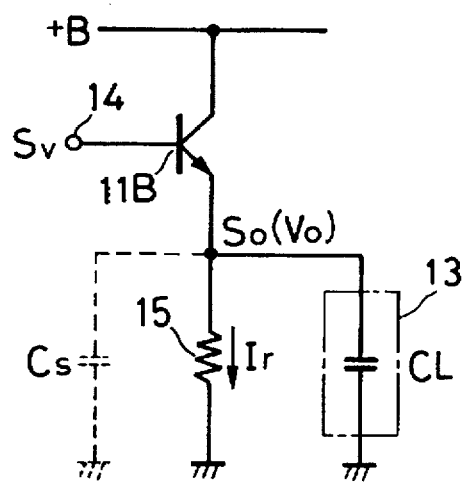
FIG. 2 is a circuit diagram showing another example of an output stage of a video signal amplifier circuit proposed previously.
Figure 3:
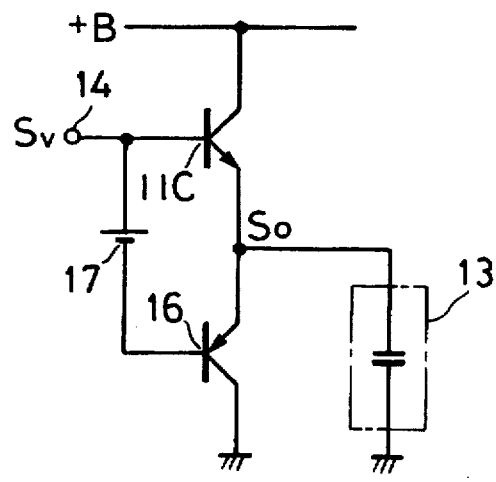
FIG. 3 is a circuit diagram showing an output stage of a video signal amplifier circuit which may be proposed with the intention of reduction in power consumption.

As explained above, the current IT6 flowing through the collector-emitter path of the transistor 46 is not required to have the maximum of the current value necessitated for driving the load connected to the video signal output terminal 25 but need only have the current value necessary for driving the load under a situation wherein the current IT6 is set to drive the load in response to frequency components of the video signal SVA over a frequency band including a certain upper limit frequency. Accordingly, compared with the current value Io which the current source 12 used in the circuit shown in FIG. 1 is required to have or the current value Ir which is required to flow through the resistor 15 used in the circuit shown in FIG. 2, the current value of the current IT6 flowing through the collector-emitter path of the transistor 46 is remarkably small. This results in effective reduction in power consumption in the embodiment shown in FIG. 5.

Although the above described embodiment shown in FIG. 5 is used for constituting the output stage of the video signal amplifier circuit, the wide-band amplifier circuit according to the present invention is not limited to such an example as described above and may be applied to various other amplifier circuits without departing from the scope or spirit of the invention as defined in the appended claims.

What is claimed is:

1. A wide-band amplifier circuit comprising:
   a first transistor having a base supplied with an input signal fed in at an input terminal,
   a first impedance circuit,
   a second transistor connected in series through said first impedance circuit portion to a collector-emitter path of said first transistor for functioning as a diode,
   a first resistor,
   a third transistor connected with said second transistor to form a first current mirror circuit, said third transistor having a collector connected through said first resistor to a first end of a power source,
   a fourth transistor having a base connected to a connecting point between said collector of said third transistor and said first resistor,
   a fifth transistor having a collector-emitter path connected in series to a collector-emitter path of said fourth transistor,
   a sixth transistor having a base supplied with said input signal,
   a second impedance circuit including a second resistor and a capacitor,
   a seventh transistor connected in series through said second impedance circuit to a collector-emitter path of said sixth transistor so as to form a second current mirror circuit together with said fifth transistor,
   an eighth transistor having a collector-emitter path connected between a first end of said second impedance circuit and said first end of said power source and a base thereof connected to a bias voltage,
   a third resistor connected between a second end of said second impedance circuit and a second end of said power source, and
   an output terminal connected to a connection point between an emitter portion of the said fourth transistor and the collector of said fifth transistor.

2. The wide-band amplifier circuit according to claim 1, wherein each of said first to eighth transistors is of the NPN type.

3. The wide-band amplifier circuit according to claim 1, wherein said first to eighth transistors and said first to third resistors constitute a semiconductor integrated circuit.

4. The wide-band amplifier circuit according to claim 1, wherein the collectors of each of said first transistor, said fourth transistor and said sixth transistor are connected directly to said first end of said power source.

5. The wide-band amplifier circuit according to claim 1, wherein said second resistor and said capacitor included in said second impedance circuit portion are connected in parallel with each other between said first end and said second end of said second impedance circuit.

6. The wide-band amplifier circuit according to claim 1, wherein said input signal is a video signal.

* * * * *